(12) United States Patent
Van der Velden

(10) Patent No.: US 11,281,824 B2
(45) Date of Patent: Mar. 22, 2022

(54) AUTHORING LOADING AND BOUNDARY CONDITIONS FOR SIMULATION SCENARIOS

(71) Applicant: Dassault Systemes Simulia Corp., Johnston, RI (US)

(72) Inventor: Alexander Jacobus Maria Van der Velden, Atlanta, GA (US)

(73) Assignee: DASSAULT SYSTEMES SIMULIA CORP., Johnston, RI (US)

( * ) Notice: Subject to any disclaimer, the term of this patent is extended or adjusted under 35 U.S.C. 154(b) by 497 days.

(21) Appl. No.: 15/841,081

(22) Filed: Dec. 13, 2017

(65) Prior Publication Data

US 2019/0179977 A1    Jun. 13, 2019

(51) Int. Cl.
| | | |
|---|---|---|
| G06F 30/23 | (2020.01) | |
| G06N 5/02 | (2006.01) | |
| G06N 20/00 | (2019.01) | |

(52) U.S. Cl.
CPC ............ G06F 30/23 (2020.01); G06N 20/00 (2019.01); *G06N 5/025* (2013.01)

(58) Field of Classification Search
CPC ...... G06F 30/20; G06F 30/23; G06F 17/5009; G06N 20/00; G06N 5/025; G06T 17/00
See application file for complete search history.

(56) References Cited

U.S. PATENT DOCUMENTS

| | | |
|---|---|---|
| 5,966,140 A | 10/1999 | Popovic et al. |
| 6,397,206 B1 | 5/2002 | Hill et al. |
| 6,570,568 B1 | 5/2003 | Horn et al. |
| 6,615,503 B1 | 9/2003 | Nzomigni et al. |
| 6,642,929 B1 | 11/2003 | Essafi et al. |
| 6,721,614 B2 | 4/2004 | Duncan et al. |
| 6,768,928 B1 | 7/2004 | Nagasawa et al. |
| 6,778,970 B2 | 8/2004 | Au |
| 7,027,054 B1 | 4/2006 | Cheiky et al. |

(Continued)

FOREIGN PATENT DOCUMENTS

| | | |
|---|---|---|
| CN | 1647112 A | 7/2005 |
| CN | 101059335 A | 10/2007 |

(Continued)

OTHER PUBLICATIONS

Machinery Handbook 27th Edition, p. 1495, Industrial Press, Inc., New York, N.Y. (2004) (Year: 2004).*

(Continued)

*Primary Examiner* — Jay Hann
(74) *Attorney, Agent, or Firm* — Hamilton, Brook, Smith & Reynolds, P.C.

(57) ABSTRACT

Unlike existing methods that rely on a manual procedure for setting conditions for performing computer-based simulations, embodiments automatically set conditions for a simulation of a real-world object represented by a computer aided design (CAD) model. In one such embodiment, the morphology of a CAD mode is analyzed to identify a function of an element of the CAD model. In turn, conditions for a simulation are defined based upon one or more rules corresponding to the identified function of the element of the CAD model, where said defining includes automatically setting conditions in a simulation of the real-world physical object.

20 Claims, 8 Drawing Sheets

(56) References Cited

U.S. PATENT DOCUMENTS

| | | | |
|---|---|---|---|
| 7,219,043 B2 * | 5/2007 | Rebello | G05B 19/4097 703/7 |
| 7,269,808 B2 | 9/2007 | Bruce et al. | |
| 7,372,995 B2 * | 5/2008 | Iwase | G06F 30/20 382/199 |
| 7,583,272 B2 | 9/2009 | Ramani et al. | |
| 7,657,083 B2 | 2/2010 | Parr et al. | |
| 7,688,318 B2 | 3/2010 | O'Malley, III et al. | |
| 7,733,340 B1 | 6/2010 | Desimone et al. | |
| 7,913,190 B2 | 3/2011 | Grimaud et al. | |
| 8,248,407 B2 | 8/2012 | Deslandes | |
| 8,416,240 B1 | 4/2013 | Kuffner et al. | |
| 8,606,774 B1 | 12/2013 | Makadia et al. | |
| 8,659,596 B2 | 2/2014 | Corazza et al. | |
| 8,812,272 B2 | 8/2014 | Martin et al. | |
| 8,976,179 B2 | 3/2015 | Kuffner et al. | |
| 8,982,122 B2 | 3/2015 | Corazza et al. | |
| 9,239,895 B2 * | 1/2016 | Huang | G06F 30/23 |
| 9,304,332 B2 | 4/2016 | Fonte et al. | |
| 9,449,430 B2 | 9/2016 | Janvier | |
| 9,798,835 B2 | 10/2017 | Rorato | |
| 9,830,703 B2 | 11/2017 | Meyer et al. | |
| 9,881,388 B2 | 1/2018 | Rorato et al. | |
| 9,916,345 B1 | 3/2018 | Makadia et al. | |
| 9,916,538 B2 | 3/2018 | Zadeh et al. | |
| 10,198,488 B2 | 2/2019 | Marini et al. | |
| 10,303,784 B2 | 5/2019 | Rorato | |
| 10,394,977 B2 * | 8/2019 | Spears | G06F 30/23 |
| 10,719,549 B2 | 7/2020 | Lieutier | |
| 10,929,433 B2 | 2/2021 | Rorato | |
| 2002/0008700 A1 | 1/2002 | Fuki | |
| 2002/0095276 A1 | 7/2002 | Rong et al. | |
| 2002/0167516 A1 | 11/2002 | Loop | |
| 2003/0191627 A1 | 10/2003 | Au | |
| 2004/0122630 A1 * | 6/2004 | Fife | G06F 30/23 703/2 |
| 2007/0279414 A1 | 12/2007 | Vandenbrande et al. | |
| 2008/0143714 A1 | 6/2008 | Huang et al. | |
| 2008/0260238 A1 | 10/2008 | Pfister et al. | |
| 2009/0157649 A1 | 6/2009 | Papadakis et al. | |
| 2009/0182450 A1 | 7/2009 | Goldschmidt | |
| 2010/0082142 A1 * | 4/2010 | Usadi | G06F 30/23 703/2 |
| 2010/0121626 A1 | 5/2010 | Montana et al. | |
| 2011/0069336 A1 | 3/2011 | Lin et al. | |
| 2011/0224813 A1 | 9/2011 | Takatsuka | |
| 2012/0078587 A1 | 3/2012 | Martin et al. | |
| 2012/0173212 A1 | 7/2012 | Rameau et al. | |
| 2014/0184594 A1 | 7/2014 | Janvier | |
| 2014/0188439 A1 | 7/2014 | Rorato | |
| 2014/0192050 A1 | 7/2014 | Qiu et al. | |
| 2014/0354636 A1 | 12/2014 | Rorato et al. | |
| 2014/0379309 A1 * | 12/2014 | Banta | G06F 30/23 703/1 |
| 2015/0032420 A1 * | 1/2015 | Tristano | G06F 30/17 703/1 |
| 2015/0199850 A1 | 7/2015 | Uematsu et al. | |
| 2016/0004739 A1 | 1/2016 | Tyercha et al. | |
| 2016/0019270 A1 | 1/2016 | Jones et al. | |
| 2016/0117792 A1 | 4/2016 | Rolland-Neviere et al. | |
| 2016/0217610 A1 | 7/2016 | Liu et al. | |
| 2016/0350335 A1 | 12/2016 | Rorato | |
| 2016/0350387 A1 | 12/2016 | Marini et al. | |
| 2017/0371948 A1 | 12/2017 | Rorato | |
| 2018/0004836 A1 | 1/2018 | Lewis | |
| 2018/0137118 A1 | 5/2018 | Lieutier | |

FOREIGN PATENT DOCUMENTS

| | | |
|---|---|---|
| CN | 101995231 A | 3/2011 |
| EP | 0 646 884 A2 | 4/1995 |
| EP | 0 646 884 A3 | 7/1995 |
| EP | 0 964 364 | 12/1999 |
| EP | 2 169 567 | 3/2010 |
| EP | 2 387 004 | 11/2011 |
| JP | 2000-57184 A | 2/2000 |
| JP | 2001250130 | 9/2001 |
| JP | 2003518294 | 6/2003 |
| JP | 2005049923 | 2/2005 |
| JP | 2006285570 | 10/2006 |
| JP | 2010211629 | 9/2010 |
| JP | 2012069108 | 4/2012 |
| WO | 2004/068300 | 8/2004 |
| WO | 2008/094170 | 8/2008 |
| WO | 2011/103031 | 8/2011 |
| WO | 2013/155858 A1 | 10/2013 |
| WO | 2015/085435 | 6/2015 |

OTHER PUBLICATIONS

Li, C., et al. "Preparation of CAD Model for Finite Element Analysis" 2010 Int'l Conf. on Computer Mechatronics Control and Electronic Engineering, CMCE 2010, pp. 491-494 (2010) (Year: 2010).*

Danglade, F., et al. "On the use of Machine Learning to Defeature CAD Models for Simulation" Computer Aided Design & Applications, vol. 11, No. 3, pp. 358-368 (2013) available from <http://dx.doi.org/10.1080/16864360.2013.863510> (Year: 2013).*

Danglade, F., et al. "A Priori Evaluation of Simulation Models Preparation Processes Using Artificial Intelligence Techniques" Computers in Industry, vol. 91, pp. 45-61 (Jun. 2017) (Year: 2017).*

Abbey, T. "FEA Loading Tips" Digital Engineering 24/7 (2014) available at <https://www.digitalengineering247.com/article/fea-loading-tips/> (Year: 2014).*

Assflag, J, et al., "Retrieval of 3d objects using curvature maps and weighted walkthroughs," In 12th International Conference on Image Analysis and Processing, 2003 Proceedings, pp. 348-353, IEEE, (2003).

3DPartFinder by 3DSemantix—Geometric search engine > Home; http://www.3dpartfinder.com. 9 pages (date unavailable).

Altmeyer, J., et al., "Reuse of Design Objects in CAD Frameworks", IEEE/ACM International Conference on Computer-Aided Design, Digest of Technical Papers, pp. 754-761, Nov. 6, 1994.

Babic, B., et al., "A Review of Automated Feature Recognition with Rule-Based Pattern Recognition", Computers in Industry, 59:321-337 (2007).

Beardsly, J., "Seamless Servers: The case for and against", Massively Multiplayer Game Development, Section 3.1, 211-227 (date unavailable).

Besplov, D., et al., "Local Feature Extraction and Matching Partial Objects", Computer Aided Design, vol. 38: 1020-1037(2006).

Biasotti, S., et al., "Sub-part correspondence by structural descriptors of 3D shapes", Computer Aided Design, 38(9): 1002-1019 (Sep. 2006).

Boltchev, D., et al., "An Iterative Algorithm for Homology Computation on Simplical Shapes", Computer Aided Design, vol. 43, No. 11, pp. 1457-1467 Sep. 2, 2011.

Briere-Cote, A., et al., "Comparing 3D CAD Models: Uses, Methods, Tools and Perspectives", Computer-Aided Design and Applications, 9(6): 771-794 (2012).

Cardone, A., et al. "A Survey of Shape Similarity Assessment Algorithms for Product Design and Manufacturing Applications", Journal of Computing and Information Science in Engineering, vol. 3 No. 2, pp. 109-118 (Jun. 2003).

Chiang, L., et al. "Identification of Patterns of Repeated Parts in Solid Objects", IMATI Report Series, pp. i-111, Nov. 2, 2016.

Clark, D.E.R., et al., "Benchmarking shape signatures against human perceptions of geometric similarity", Computer-Aided Design, 38(9): 1038-1051 (Sep. 2006).

Cornelio, A., et al., "Integration and Cataloging of Engineering Design Information", Systems Integration '90, IEEE Comput., Soc., US, pp. 720-729 (Apr. 23, 1990).

CreoTMParametric Data Sheet, © 2011 Parametric Technology Corporation, http://www.creo.uk.com/creo_parametric_mapping.htm, last accessed Mar. 27, 2014.

(56) References Cited

OTHER PUBLICATIONS

Dang, Q.V., et al., "Similarity Detection for Free-Form Parametric Models", 21st International Conference on Computer Graphics, Visualization and Computer Vision, pp. 239-248 (2013).
Daras, P., et al., "A 3D Shape Retrieval Framework Supporting Multimodal Queries", Int J. Comput Vis 89: 229-247 (2010).
EP Search Report for EP 10 30 6026, titled: Designing a Modeled Object Within a Session of a Computer-Aided Design System Interacting With a Database, dated Feb. 3, 2011.
EP Search Report for EP 12 30 6720, titled: Groups of Faces That Form a Geometrical Pattern, dated Jul. 4, 2013.
EP Search Report for EP 12 30 6721, titled: Geometrical Elements Transformed by Rigid Motions, dated May 13, 2013.
EP Search Report for EP 13 30 5700, titled: Compression and Decompression of 3D Modeled Object, dated Aug. 14, 2013.
EP Search Report for EP 16 17 6763, dated Dec. 1, 2016.
EP Search Report for EP 16 30 6488, dated May 23, 2017.
EP Search Report for EP 16 30 6790, dated Jun. 7, 2017.
Falcidieno, B., et al., "A System for Extracting and Representing Feature Information Driven by the Application Context", Proceedings of the IEE International Conference on Robotics and Automation, 1672-1678 (1990).
Fonseca, M.J., et al., "Towards content-based retrieval of technical drawings through high-dimensional indexing", Computers and Graphics, 27(1): 61-69 (Feb. 2003).
Frosini, P., et al. "Combining Persistent Homology and Invariance Groups for Shape Comparison", Discrete & Computational Geometry, vol. 55, No. 2, pp. 373-409, Feb. 2, 2016.
Funkhouser, T., et al., "Modeling by Example", ACM Transactions on Graphics, 23(3): 652-663 (Aug. 1, 2004).
Funkhouser, T., et al., "A Search Engine for 3D Models", ACM Transactions on Graphics, vol. V, No. N 10 202002 (date unavailable).
Gordon, L., "Comparing 3D CAD Modelers What Designers should know about history-based and dynamic schemes", Machine Design, Nov. 22, 2006.
Imoru, C.O., et al., "On a Version of the Banach's Fixed Point Theorem", General Mathematics, vol. 16, No. 1, pp. 25-32 (2008).
Ismail, et al., "Feature recognition patterns for form features using boundary representation models", International Journal of Advanced Manufacturing Technology Springer-Veraguk, vol. 20, No. 8, pp. 553-556, (2002).
Kao, et al, "Extraction of 3D Object Features from CAD Boundary Representation using the Super Relation Graph Method", Transactions on Pattern Analysis and Machine Intelligence, IEEE, Piscataway, USA, vol. 17, No. 12, pp. 1228-1233, Dec. 1, 1995.
Kazhdan, M., et al., "Harmonic 3D Shape Matching", ACM SIGGRAPH Symposium on Computer Animation, p. 191 (Jul. 21, 2002).
Kazhdan, M., et al., "Rotation Invariant Spherical Harmonic Representation of 3D Shape Descriptors", Eurographics Symposium on Geometry Processing, 9 pages (2003).
Lee, K.S., et al., "Framework of an evolutionary design system incorporating design information and history", Computers in Industry, 44(3): pp. 205-227 (Apr. 2001).
Ma, L., et al. Automatic Discovery of Common Design Structures in CAD models, Computers & Graphics 34, pp. 545-555 (2010).
Maranzana, R., "3D Data Mining Part and Information Re-Use in a PLM Context", Proceedings of GT2007, May 14-17, 2013, Montreal, CA, ASME Paper: GT2007-27966, American Society of Mechanical Engineers, NY, NY 2007. http://dx.doi.org/10.1115/GT2007-27966, 37 pages (2013).
Munkres, J.R., "Elements of algebraic topology", Addison-Wesley Publishing Company, Inc. 1984.
Oudot, S., Topological Signatures:, Presentation given in Springs School in LA Marsa, pp. 1-86, Apr. 2016.
Pauly, et al., "Discovering structural regularity in 3D geometry", ACM Transactions on Graphics (TOG)—Proceedings of ACM SIGGRAPH TOG Homepage, vol. 27, No. 3, Aug. 2008.
Papadakis, P., et al., "Efficient 3D shape matching and retrieval using a concrete radialized spherical projection representation", ScienceDirect, 40:2437-2452 (2007).
Petre, R.D., et al., "An experimental evaluation of view-based 2D/3D indexing methods", 2010 IEEE 26th Convention of Electrical and Electronic Engineers in Israel, pp. 924-928, Nov. 2010.
Santa-Cruz, D., et al., "Compression of Parametric Surfaces for Efficient 3D Model Coding", VCIP, 4671: 280-291 (2002).
Shih, R., "Parametric Modeling with CreoTM Parametric: An Introduction to CreoTM Parametric 1.9", SDC Publications © 2011 (table of contexts only).
Shikhare, D., et al. "Compression of Large 3D Engineering Models Using Automatic Discovery of Repeating Geometric Features", National Centre for Software Technology, 233-240 (2001).
Tangelder, J., et al., "A Survey of Content Based 3D Shape Retrieval Methods", Multimedia Tools and Applications, Kluwer Academic Publishers, vol. 39, No. 3, pp. 441-471; Dec. 8, 2007.
Wagner, et al. "Modeling Software with Finite State Machines", Auerbach Publications, 2006.
Wang, et al. "EQSM: An efficient high quality surface grid generation method based on remeshing", Computer Methods in Applied Mechanics and Engineering, North Holland, Amsterdam, vol. 195 No. 41-43, pp. 5621-5633, Aug. 15, 2006.
Werghi, D., "Extracting Ordered Patterns from a Triangular Mesh Surface", IEEE Potentials, IEEE, NY, NY, USA, vol. 30, No. 6, pp. 34-43, Nov. 2, 2011.
Working with Pattern Recognition; http://learningexchange.ptc.com/tutorial/519/working-with-pattem-recognition (date unavailable).
Yang, M., et al., "A Survey of Shape Feature Extraction Techniques", Peng-Yeng Yin, Pattern Recognition, IN-TECH, pp. 43-90 (2008).
Boussuge, et al., "Template-based Geometric Transformations of a Functionally Enriched DMU into FE Assembly Models," Computer-Aided Design & Applications, 11(4), 436-449 (2014).
Marchetta, et al., "An artificial intelligence planning approach to manufacturing feature recognition," Computer-Aided Design, 42:248-256 (2010).
European Search Report, EP18212155.8, "Methods And Systems For Authoring Simulation Scenarios," dated May 24, 2019.
Official Notice of Rejection, JP2016-104365, entitled "Querying Database With Thickness Criterion," dated Jul. 7, 2020.

\* cited by examiner

AUTHORING LOADING AND BOUNDARY CONDITIONS FOR SIMULATION SCENARIOS

BACKGROUND

A number of existing product and simulation systems are offered on the market for the design and simulation of parts or assemblies of parts. Such systems typically employ computer aided design (CAD) and computer aided engineering (CAE) programs. These systems allow a user to construct, manipulate, and simulate complex three-dimensional models of objects or assemblies of objects. These CAD and CAE systems provide a representation of modeled objects using edges or lines, in certain cases with faces. Lines, edges, faces, or polygons may be represented in various manners, e.g. non-uniform rational basis-splines (NURBS).

These CAD systems manage parts or assemblies of parts of modeled objects, which are mainly specifications of geometry. In particular, CAD files contain specifications, from which geometry is generated. From geometry, a representation is generated. Specifications, geometry, and representations may be stored in a single CAD file or multiple CAD files. CAD systems include graphic tools for representing the modeled objects to designers; these tools are dedicated to the display of complex objects. For example, an assembly may contain thousands of parts. A CAD system can be used to manage models of objects, which are stored in electronic files.

The advent of CAD and CAE systems allows for a wide range of representation possibilities for objects. One such representation is a finite element analysis (FEA) model. The terms FEA model, finite element model (FEM), finite element mesh, and mesh are used interchangeably herein. A FEM typically represents a CAD model, and thus, may represent one or more parts or an entire assembly. A FEM is a system of points called nodes which are interconnected to make a grid, referred to as a mesh. The FEM may be programmed in such a way that the FEM has the properties of the underlying object or objects that it represents. When a FEM or other such object representation as is known in the art is programmed in such a way, it may be used to perform simulations of the object that it represents. For example, a FEM may be used to represent the interior cavity of a vehicle, the acoustic fluid surrounding a structure, and any number of real-world objects. Moreover, CAD and CAE systems along with FEMs can be utilized to simulate engineering systems, such as real-world physical systems, e.g., cars, planes, buildings, and bridges. Further, CAE systems can be employed to simulate any variety and combination of behaviors of these physical systems, such as noise and vibration.

SUMMARY

Embodiments of the invention generally relate to the field of computer programs and systems and specifically to the field of product design and simulation. Embodiments of the invention may be employed in video games, engineering system design and fabrication, collaborative decision making, and entertainment, e.g., movies.

As described above, systems exist for simulating real-world physical objects. However, these existing systems can benefit from processes that provide automated simulation functionality and improved speed. Example simulation modeling processes include: (1) importing geometry as a native CAD or boundary representation model, (2) placing loads and boundary conditions on the geometry (model), (3) meshing the geometry, and (4) performing the simulation. In the existing simulation methods the process of placing loads and defining boundary conditions is a time consuming and manual task that greatly increases the time and complexity of simulation methodologies. Embodiments of the present invention solve these problems and provide functionality to automatically set simulation conditions.

One such embodiment provides a computer-implemented method of simulating a real-world physical object by automatically setting conditions for a simulation of the real-world physical object represented by a CAD model. In particular, an example embodiment begins by analyzing morphology of a CAD model that represents a real-world physical object and identifying a function of an element of the CAD model. In an example embodiment, analyzing the morphology may including analyzing the topology and geometry of the CAD model to determine functions of features and components of the CAD model. Having identified the function of an element of the CAD model, the method continues by defining at least one of a loading condition and a boundary condition for the element of the CAD model based upon rules that correspond to the identified function of the element of the CAD model. Thus, the defining may leverage a database of stored, predefined rules that link functionality with simulation conditions, such as loading and boundary conditions. In this way, the defining automatically sets conditions in a simulation of the real-world physical object that the model represents.

In an embodiment, analyzing the morphology of the CAD model includes analyzing at least one of: topology and dimensions of the element of the CAD model. According to an embodiment, in addition to defining the loading and/or boundary condition using rules corresponding to the identified function, the defining is further based on a solver type of the simulation. In such an embodiment, the rules used in the defining may correspond to both the identified function of the element of the CAD model and the solver type of the simulation. Further still, in yet another embodiment, defining the at least one loading and boundary condition for the element of the CAD model is also based upon a material of the element of the CAD model.

As described herein, embodiments may leverage predefined rules that correspond to one or more functionalities of elements of CAD models. In an embodiment, these predefined rules are user developed rules that associate at least one of a loading condition and a boundary condition with functionality of an element of a CAD model. In contrast, in an alternative embodiment, the method further includes automatically identifying the one or more rules using machine learning analysis of a plurality of CAD models. The machine learning analysis may include identifying associations between functionality of elements of the plurality of CAD models and at least one of boundary conditions and loading conditions defined for the elements of the plurality of CAD models. Such an embodiment may thus, automatically determine rules through analyzing CAD models with defined loading and boundary conditions rather than relying on user defined rules. Further, embodiments may leverage rules that are both user defined and automatically determined through machine learning analysis.

According to an embodiment, the element of the CAD model is formed by a plurality of boundary representations. In such an embodiment, the method step of defining at least one of a loading condition and a boundary condition includes defining at least one of a boundary condition and a loading condition for each of the plurality of boundary representations.

Another embodiment of the present invention is directed to a system for automatically setting conditions for a simulation of a real-world physical object represented by a CAD model. The system includes a processor and a memory with computer code instructions stored thereon that cause the system to set the simulation conditions as described herein. In an example embodiment, the system is configured to analyze morphology of a CAD model representing a real-world physical object and identify a function of an element of the CAD model. Using the identified function, the system defines at least one of a loading condition and a boundary condition for the element of the CAD model based upon one or more rules corresponding to the identified function. This defining automatically sets conditions in a simulation of the real-world physical object. According to an embodiment of the system, in analyzing the morphology of the CAD model, the processor and the memory, with the computer code instructions, are further configured to cause the system to analyze at least one of: topology and dimensions of the element of the CAD model.

In an embodiment of the system, the defining is also based on a solver type of the simulation. For instance, such an embodiment may vary the defined loading and boundary conditions if, for example, the solver is a computational fluid dynamics solver rather than a structural solver. Similarly, in such an embodiment, the one or more rules may correspond to both: (i) the identified function of the CAD model and (ii) the solver type. According to an example embodiment, the one or more rules corresponding to the identified function of the element of the CAD model are pre-defined and stored in a database. In one such example embodiment, the pre-defined rules are user developed rules that associate at least one of a loading condition and a boundary condition with functionality of an element of a CAD model. In an alternative embodiment, the processor and the memory, with the computer code instructions, are further configured to cause the system to automatically identify the one or more rules using machine learning analysis of a plurality of CAD models. In such an embodiment, the machine learning analysis implemented by the system identifies associations between functionality of elements of a plurality of models and simulation conditions defined for the elements of the plurality of CAD models.

Further still, in yet another embodiment, the element of the CAD model is formed by a plurality of boundary representations and, in the defining, the processor and the memory, with the computer code instructions, are further configured to cause the system to define at least one of a boundary condition and a loading condition for each of the plurality of boundary representations.

Another embodiment of the present invention is directed to a cloud computing implementation for automatically setting simulation conditions. Such an embodiment is directed to a computer program product executed by a server in communication across a network with one or more clients, where the computer program product comprises a computer readable medium. In such an embodiment, the computer readable medium comprises program instructions which, when executed by a processor, causes the processor to analyze morphology of a CAD model representing a real-world physical object and identify a function of an element of the CAD model. Further, the executed computer program product causes the server to define at least one of a loading condition and a boundary condition for the element of the CAD model based upon one or more rules that correspond to the identified function of the element of the CAD model. In this way, the defining automatically sets conditions in a simulation of the real-world physical object.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

The teachings of all patents, published applications and references cited herein are incorporated by reference in their entirety.

Existing simulation work flows include: (i) importing model geometry as native CAD or boundary representation, (ii) placing loads and boundary conditions on the imported model, (iii) meshing the model, and (iv) performing the simulation with the mesh model. Unlike these existing processes, embodiments provide functionality to automatically set conditions for simulations rather than relying on manual setting of simulation conditions.

Figure 1:
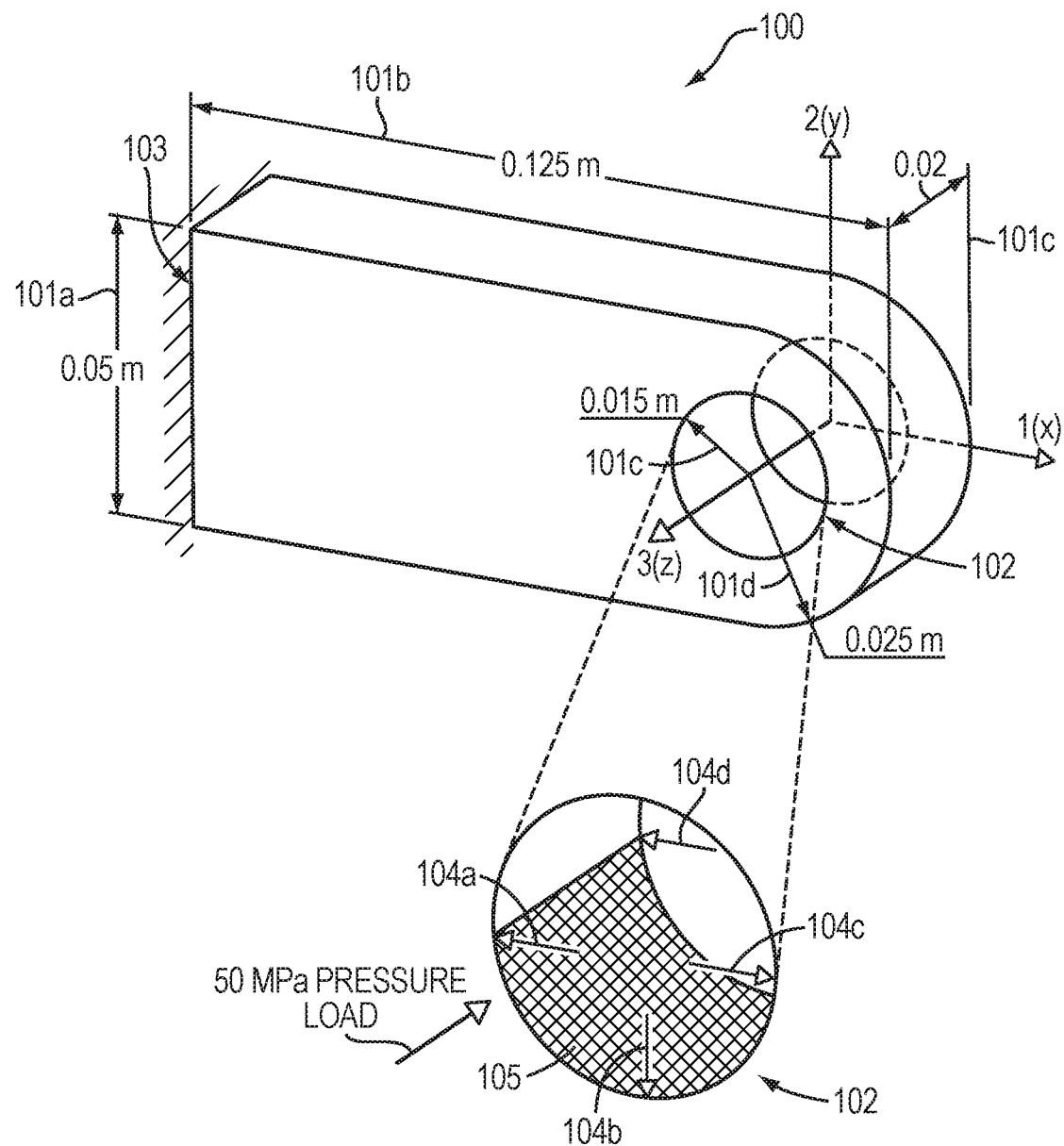
FIG. 1 depicts a model that may be used in embodiments.

FIG. 1 depicts an example model of a lug 100 that may be used in a simulation as described herein. The model 100 has the dimensions 101a-e and includes the element 102, i.e., the hole 102. Methods described herein, e.g., the method 220, may use the model 100 to set loading and boundary conditions in a simulation using the model 100. To illustrate, in a simulation, the lug is welded to a structure (not shown) at the end 103 and as mentioned, the lug 100 includes the hole 102. When in use, and in the simulated scenario, a bolt (not shown) is placed through the hole 102 of the lug 100. In a simulation, the static deflection of the lug 100 occurs when a load, e.g., 30 kN, is applied to the bolt. According to an embodiment, the load applied to the bolt, e.g. 30 kN, and likewise, the direction of the load, may be set by a user or, alternatively, automatically determined using the principles described herein.

Further, the simulation can be implemented using an existing simulation software suite such as Abaqus/Standard that is modified to perform the methods described herein. In such an embodiment, rather than including the complex bolt-lug 100 interaction in the simulation, the simulation determines the static deflection using a distributed pressure 104a-d over the bottom half 105 of the hole 102. Using existing methods, each component 104a-d of the pressure needs to be manually set. However, through the methods described herein, e.g., the method 220, such conditions can be automatically configured.

The placing of loads, e.g., the pressures 104*a-d* and boundary conditions, e.g., the anchored end 103 of the lug 100, is cumbersome because continuous surfaces are often broken into multiple boundary representations over which the loads and boundary conditions are applied. Setting simulation conditions is further complicated by model complexity. Often, the locations for loads and boundary conditions are hidden inside complex structures. For instance, rivets and bolts may be located inside a wing body of a model representing an airplane. In such a scenario, the rivets and bolts are not visible and it requires significant manual effort to identify the rivets and bolts and set the simulation conditions for these components once identified.

In addition, the manual process of setting simulation conditions often interferes with the correct placement of loads and boundary conditions in cases where an automatic geometric variation is created upon placing the loads and boundaries. These automatically created geometric variations break-up the existing geometric surfaces into different boundary representations (breps) and may also create different geometric topologies. For instance, geometric holes may disappear. These and other challenges limit the use of simulation software to experts that is estimated to be only 5% to 10% of CAD users. In addition, because existing methods require humans to manually author loads and boundary conditions, these existing methods prevent the use of simulation models for automated variant analysis.

While solutions exist for attempting to alleviate the required process of manually setting simulation conditions, these existing solutions are inadequate and merely move the burden of setting simulation conditions from the person performing the simulation to the user creating the original CAD model. These existing solutions fail to provide functionality to truly automate the process of setting simulation conditions. For instance, one existing solution relies on CAD model tags that are defined to describe topological features such as a hole type. If these native tags can be read by the simulation software package being utilized then it may be possible to set simulation conditions. However, such a method requires the additional step by the CAD designer to set the tags. Further, these tags can only be used when the original native CAD model is compatible with the simulation software package being employed. As such, users rarely utilize said CAD model tags.

Embodiments overcome the aforementioned problems and provide automated methods and systems for automatically setting simulation conditions. Embodiments leverage the notion that forms follows function. Because form follows function, CAD models themselves often implicitly identify where loads and boundary conditions should be placed. For instance, a large round hole of a particular dimension is likely going to be used for a bolt and an enclosed shell is likely used to contain a pressure. Thus, embodiments identify features, i.e., elements and parts, of CAD models, such has holes, flanges, etc., for the morphology, i.e., geometry, topology, and dimensions, of the CAD model and then automatically set simulation conditions based upon these identified features. The features of CAD models and the rules for setting boundary and loading conditions for these features can be automatically detected using machine learning that employs the invariant feature concept of computer vision.

To illustrate, in a CAD model, a typical bolt hole is constructed out of adjacent surfaces with the same curvature, whereby the curvature adds up to 360 degrees (cylinder). Moreover, the cylinder is open on both sides, and thus, not manifold. These characteristics are invariant, i.e., do not change, with respect to the angle of view. Thus, using machine learning, an embodiment may identify these characteristics in a CAD model and determine that the hole is a bolt hole and also identify the boundary and loading conditions that correspond to the bolt hole. Once this is learned, embodiments may identify holes in other CAD models with these invariant characteristics and determine that the holes are bolt holes and then, set the boundary and loading conditions for the holes to be the boundary and loading conditions, that were learned via machine learning, for bolt holes. While this example is described in relation to a bolt hole, embodiments may operate similarly with regard to any other invariant characteristics.

Using these automatically identified features and corresponding identified rules, embodiments set likely loads and conditions on surfaces, e.g., BREPS, of the CAD model. An embodiment may also provide an indication of the automatically identified features to a user who can either accept, modify, or remove the automatically set conditions. Likewise, in an embodiment, the user can also set values associated with the automatically identified loading and boundary conditions. Embodiments may also consider material and solver type when identifying CAD model elements and functionality. For example, an embodiment may consider material properties, e.g., material type and the material's associated characteristics, e.g., elasticity, compressibility, that are set for an element of a CAD model. Further, embodiments may combine automatically identified loading and boundary conditions with product material information, i.e., characteristics, formal requirement specifications, and machine learning to fully automate generating a simulation template, i.e., the simulation conditions.

In this way, embodiments of the invention replace the existing manual process for setting simulation conditions with an automated process that relies on previously unidentified rules that relate simulation conditions to functionality, material, and solver types associated with the CAD model and simulation. Automating the process of setting simulation conditions transforms the simulation authoring process into a configuration template process. In a typically simulation process, the user has to manually identify all of the parts where the simulation conditions apply and set the type of condition. In contrast, by using embodiments of the invention, this work is automatically done and the user only sets the numerical value of the simulation conditions e.g., load. Thus, embodiments reduce errors and makes simulation technology available to a larger group of users.

Figure 2:
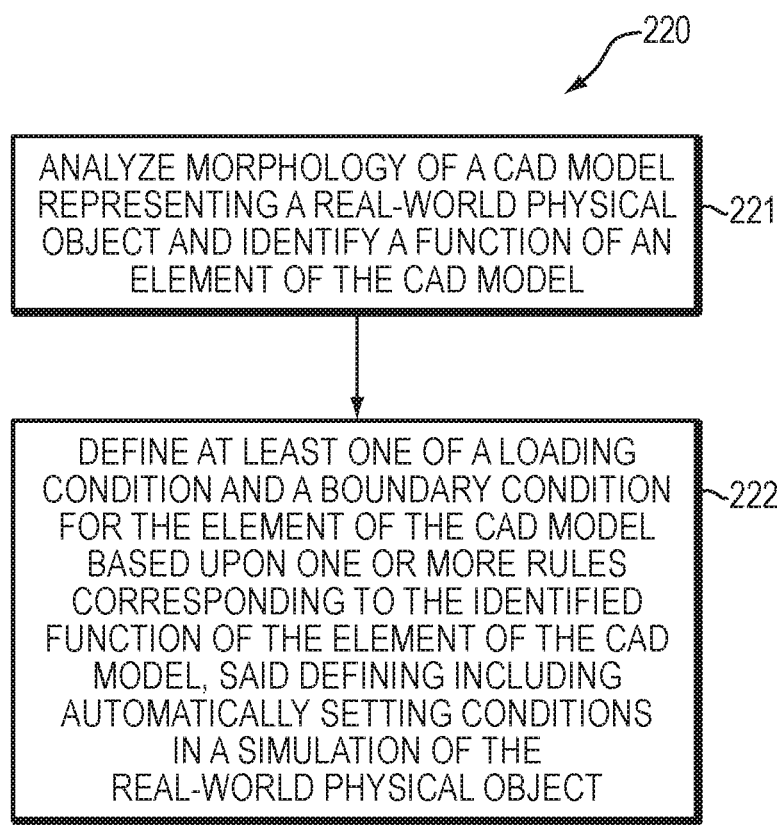
FIG. 2 is a flowchart of a method for automatically setting conditions for a simulation according to an embodiment.

FIG. 2 is a flowchart of a method 220 for setting simulation conditions according to an embodiment. The method 220 may be computer implemented and performed via any combination of hardware and software as is known in the art. For example, the method 220 may be implemented via one or more processors with associated memory storing computer code instructions that cause the processor to implement the method 220.

The method 220 begins at step 221 with analyzing morphology of a CAD model that represents a real-world physical object and identifying a function of an element, i.e., feature, of the CAD model. The analyzing at step 221 may include analyzing the form, i.e., dimensions and topology to determine a function of an element of a CAD model. The analyzing at step 221 thus, may leverage rules, such as a hole with a particular dimensions serves the function of holding a bolt, to identify the functions of elements of the CAD model. Further, the analysis at step 221 may be performed as described herein below in relation to FIG. 3. Moreover, according to an embodiment, the morphology of the CAD model may be analyzed to determine the functionality of elements of the CAD model as described in U.S. patent application Ser. No. 15/629,024.

In the method 220, the model analyzed at step 221 may be any computer based model known in the art. For example, the model may be a solid CAD model, finite element model, or a boundary representation based model. In an embodiment, analyzing the morphology includes analyzing at least one of topology and dimensions of the model. Further, the analyzing at step 221 may include identifying elements of the model in addition to identifying the function of the elements. The elements may be any features of the model known in the art. Example features include edges, holes, attachment points and any portion of the computer based model that serves any function. Example functions include attachment, support, and interfacing with other objects, amongst others. Other examples include closed surfaces (volumes) that can contain pressure loads or high aspect ratio structural elements (beams) that carry bending moments.

The analyzing at step 221 may also consider materials associated with the CAD models and elements thereof as well as geometric characteristics and the simulation solver type in which the model will be used. For example, if an element is a hole, but the material is for instance glass, it would be likely that the hole is used for ventilation rather than supporting a bolt. Similarly, if an element is a hole, but the material is very thin as compared to the diameter, it is unlikely a bolt hole or any other opening where force is applied, but more likely an opening for fluid flow. If a series of elements form a manifold surface, it is likely to contain a volume of air or liquid where pressure can be applied.

Such a determination may be automatically made by analyzing any data associated with the model, e.g., metadata or any other data regarding properties and attributes of the model, that associates materials with the CAD model and elements of the CAD model. The analysis may also consider other elements of the CAD model and relationships between said elements when determining the functionality of elements at step 221. To illustrate, in an example embodiment where the CAD model represents a car, the analysis at step 221 may identify that a hole in the wheel is dimensioned to accept another element of the model, such as an axle, and thus, the hole would be identified as supporting the axle rather than, for example, a bolt. Further, the analysis at step 221 may include identifying multiple functions for any number of the elements of the CAD model and is not limited to identifying a single function for a given element of the CAD model.

The method 220 continues at step 222 by defining at least one of a loading condition and a boundary condition for the element of the CAD model based upon rules that correspond to the function of the element of the CAD model identified at step 221. In other words, at step 222, one or more rules that indicate simulation conditions for a given function are used to set the given simulation conditions for the function of the element of the CAD model identified at step 221. The rules used at step 222 indicate functions and corresponding simulation conditions. Embodiments of the method 220 may also consider the solver type of the simulation when defining the simulation conditions at step 222. For instance, different simulation conditions may be set for a CAD model used in a computational fluid dynamics solver compared to a structural simulation solver. It is noted that embodiments of the method 220 may consider any simulator type known in the art. The relationship between simulation conditions and solver type may be a component of the rules, i.e., the rules may indicate simulation conditions for a function and a solver type. In such an embodiment, the one or more rules correspond to both the identified function of the element of the CAD model and the solver type in which the model is being used. In another embodiment, at step 222, the solver type may be accounted for outside of the rules. Moreover, the rules may also indicate solver types and materials amongst other factors. Further, in addition to functionality, material, and solver type, any considerations that have bearing on simulation conditions may be embodied in the rules.

Example rules include: (1) a sharp edge is a cutting or contact load, (2) pressure loads around an airfoil type external surface (round leading edge with a sharp trailing edges), (3) hydrostatic pressure load where there is a water tight internal volume, (4) a grip handle has a distributed handling load, (5) a knob is subject to a torque load, (6) high cross-section aspect ratio structure are subject to bending loads, (7) surfaces that contact a horizontal plane are the location of boundary conditions, and (8) in a model with a tube type topology the conditions may be solver dependent—for fluid flow the end of the tube is subject to boundary conditions and in structural solvers there are loads on the structure of the tube itself.

It is noted that, at step 222, the method 220 may set any simulation conditions known in the art in addition to loading and boundary conditions. Embodiments may set any simulation conditions for which there are rules that indicate a relationship between a function of an element of the CAD model and a simulation condition.

According to an embodiment of the method 220, the rules used at step 222 are predefined and stored on a database. In an embodiment, a computing device implementing the method 220 communicates with the database to access said rules. In an embodiment, the pre-defined rules are user defined rules that associate simulation conditions with functions of elements of CAD models. In such an embodiment, a user defines the rules and stores the rules on the database for later use.

An alternative embodiment of the method 220 utilizes rules that are automatically identified via machine learning. In such an embodiment, the rules are identified using machine learning analysis of a plurality of CAD models. In another embodiment, machine learning, as described in U.S. patent application Ser. No. 15/629,024, the contents of which are herein incorporated by reference, is used to identify features of the CAD model. Once features are identified, the function is often clear, e.g., once a feature is identified as a bolt hole, the hole's function to contain a bolt is clear, and likewise, the rules corresponding to that function may be known from past examples. According to an embodiment, the rules identify associations between functionality of elements of the plurality of CAD models and simulation conditions, i.e., boundary conditions and loading conditions, defined for the elements of the plurality of CAD models.

The method 220 and the analyzing at step 221 and defining at step 222 may be performed for any number of elements of the CAD model. Similarly, the method 220 may determine the function at step 221 and define the simulation conditions at step 222 for sub-elements of a given element. For instance, if the element is a hole, the hole may be represented by any number of individual boundary representations. In such an embodiment, the defining at step 222 includes defining simulation conditions, e.g., loading and boundary conditions, for each boundary representation that makes up the element.

To illustrate the method 220, consider an example where the CAD model is the model 100 of the lug depicted in FIG. 1. At step 221 the function of the hole (element) 102 is identified to be holding a bolt. At step 222, a rule is used that indicates that loading for a bolt in a hole is distributed on the bottom half of the hole. Using this rule, the loading 104$a$-$d$ is defined for the hole 102.

Figure 3:
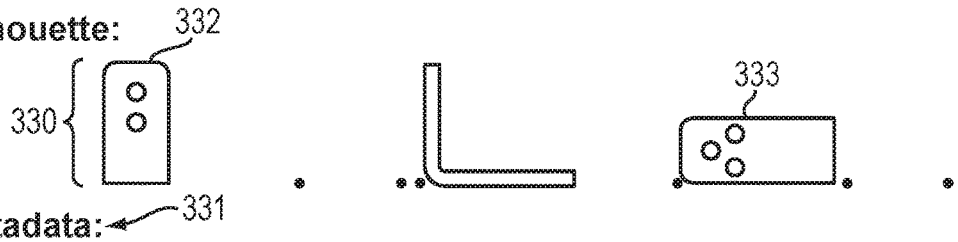
FIG. 3 illustrates data that may be employed in embodiments to define simulation conditions.

As described herein, embodiments analyze the morphology of a CAD model to identify the function of an element of a CAD model. As part of identifying functionality of elements of a CAD model, an embodiment of the present invention may also identify the elements of the CAD model themselves for which functionality is identified. FIG. 3 illustrates silhouettes 330 of a model that are generated and used to identify the elements of the CAD model from which the silhouettes 330 are generated. The silhouettes 330 provide hole configurations 332, 333 in the example and may provide other configurations of interest.

According to an embodiment, the process of identifying elements of the CAD model produces the metadata 331 that can be used to recognize the hole configurations 332 and 333. The data 331 indicates properties 334 of the holes, such as type, through, as well as the hole location, direction, and amount of contact surface. The data 331 may be generated by performing a morphology analysis of the CAD model. In an example embodiment, the analysis used to identify the elements of the CAD model is as described in U.S. patent application Ser. No. 15/629,024 entitled "Querying A Database With Morphology Criterion," the contents of which are herein incorporated by reference. According to such an embodiment, once the elements are identified using the analysis described in U.S. patent application Ser. No. 15/629,024, the appropriate functionality for the identified elements may be defined or the appropriate functionality for the identified elements may be determined from past examples. For instance, if an element is identified as a bolt hole, and in the past, a bolt hole was defined to transmit forces, the identified bolt hole may likewise, be defined to transmit forces. In such an embodiment, a database of past models, elements thereof, and associated simulation conditions and element functionalities may be leveraged to identify the functionality of identified elements.

Figure 4A:
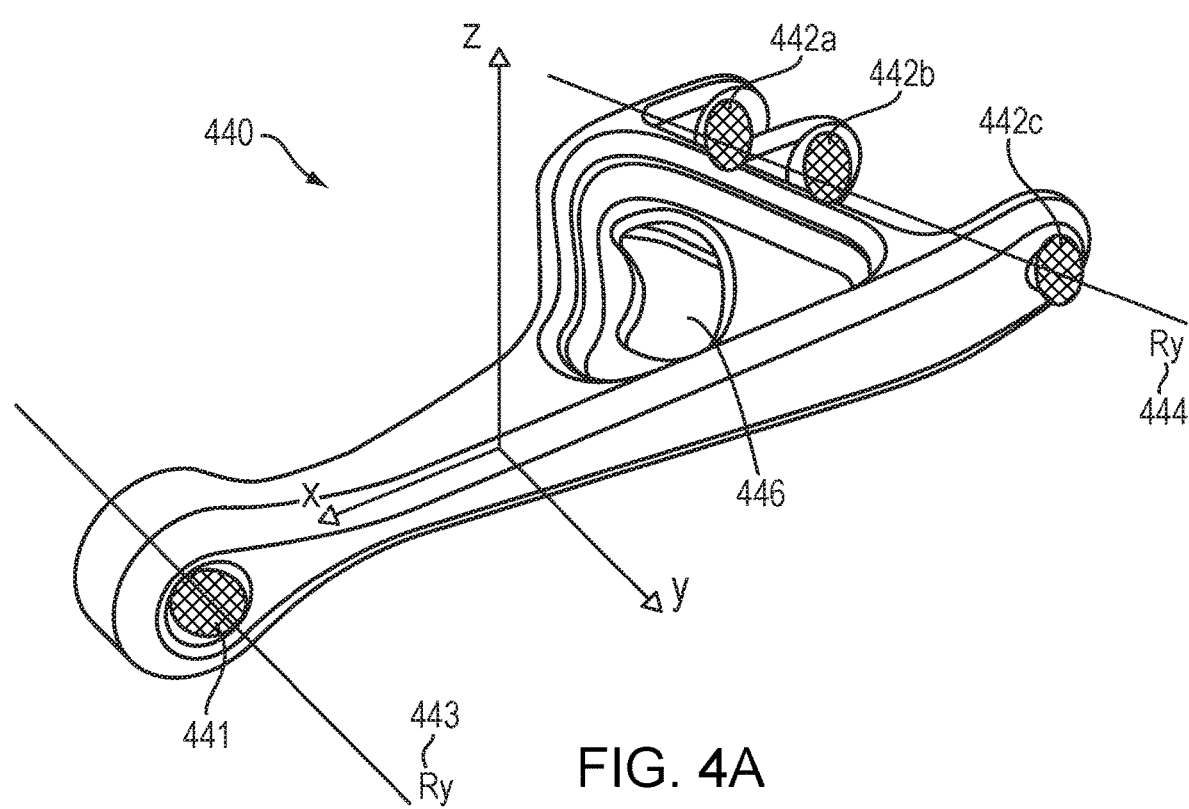
FIGS. 4A-C illustrate a CAD model through various stages of an embodiment of setting conditions for a simulation of the model.
Figure 4B:
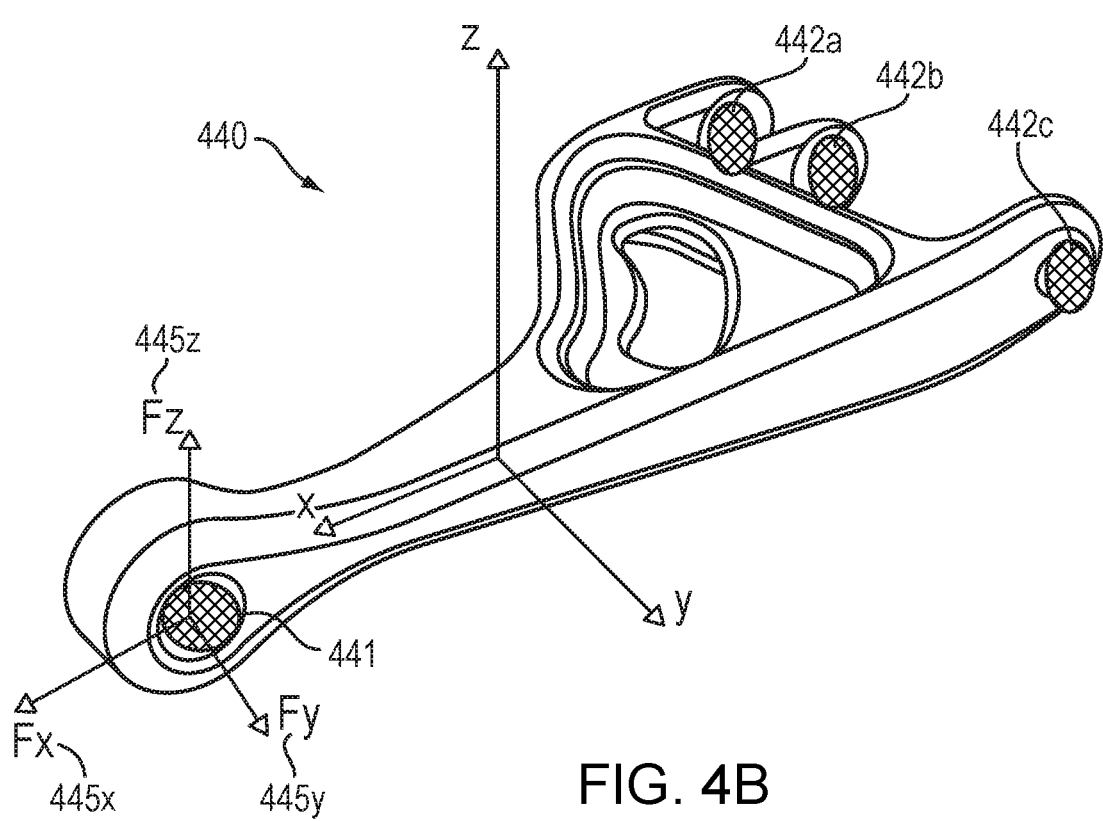
Figure 4C:
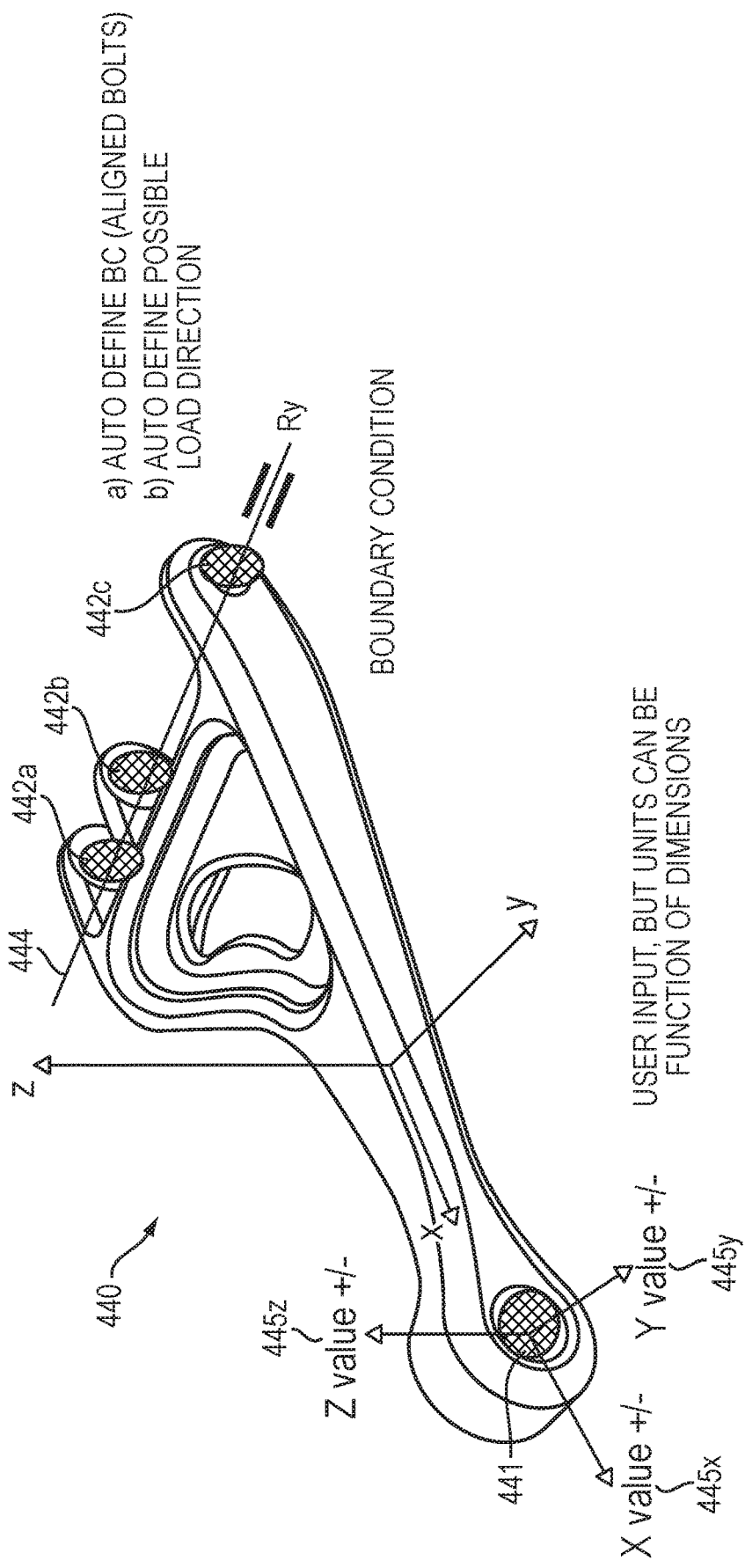

FIGS. 4A-C depicts a CAD model 440 through stages of identifying the functionality of elements of the CAD model 440 and assigning boundary and loading conditions for the elements according to an embodiment. In FIG. 4A the holes, i.e., elements, 441 and 442$a$-$c$ are identified. The holes 441 and 442$a$-$c$ may, for example, be identified using the functionality described in relation to FIG. 3. Through analyzing the location and orientation of the hole 441 the rotation function around axis Ry 443 is identified for the hole 441. Similarly, because of the location, orientation, and alignment of the holes 442$a$-$c$, the rotation function around axis Ry 444 is identified for the holds 442$a$-$c$. Further, because of the orientation, location, and geometry of the hole 446, no function is identified for the hole 446. FIG. 4B illustrates the results of an analysis, such as the analysis performed at step 221 of the method 220, that identifies that the bolt hole 441 is designed to transfer X, Y, Z, loads 445$x$-$z$ in positive and negative directions. Likewise, such an analysis also identifies that holes 442$a$-$c$ are designed to transfer X, Y, and Z loads.

The identified rotation and loading functions for the holes 441 and 442$a$-$c$ are, in turn, utilized to define simulation conditions, such as loading and boundary conditions, for the holes 441 and 442$a$-$c$. FIG. 4C depicts on the model 440 that because the loads for the holes 441 and 442$a$-$c$ have to be balanced with reaction forces at boundary conditions, the rotation axis through hole 441 is defined as a boundary condition with a free rotation axis and likewise, the positive and negative load values 445$x$-$z$ are defined for the hole 441.

In addition to defining the simulation conditions, embodiments may also automatically set values for the automatically determined simulation conditions. In an embodiment, these values may be determined by referencing a model specification. In such an embodiment, the model specification provides a set of performance parameters and the values of these parameters and, in turn, these parameters and values are used to set the values for the automatically determined simulation conditions. For instance, if a hole is a bolt hole, the dimensions of the bolt that fit into the bolt hole would be know. Then, a specification which indicates the strength and other parameters of that size bolt can be used to set the values for the automatically determined simulation conditions. Likewise, in an embodiment, material properties for the simulation may be set by referencing the specifications.

Further, in an embodiment where the model is a BREP CAD model, an embodiment may generate a computation mesh based on the CAD model and transfer the loading and boundary conditions from the CAD geometry to the mesh model. In turn, a finite element simulation solver, as is known in the art, is used with the model and the model's defined conditions to determine behavior, e.g., stress and strain, of the model and thus, the underlying real-world physical object that the model represents. Further still, results of the simulation can be used to improve the design of the real-world object through for example, an optimization simulation. Likewise, results of the simulation can be used to generate the real-world object itself through, for example, interfacing with a manufacturing machine.

Figure 5:
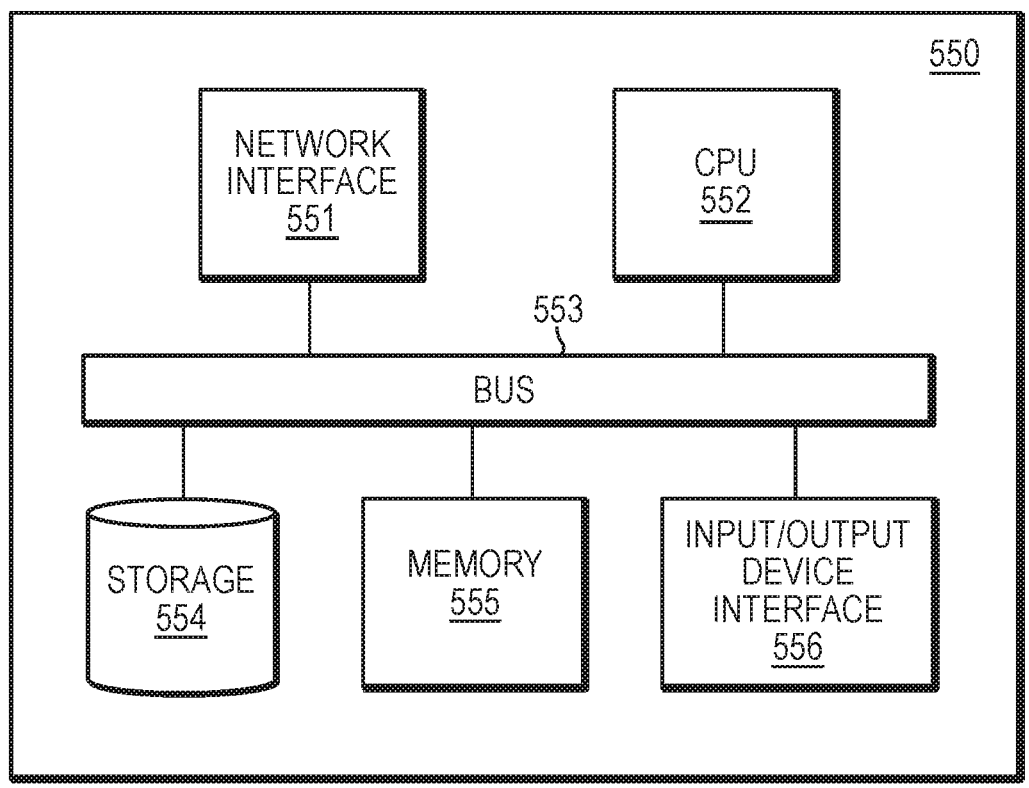
FIG. 5 is a simplified block diagram of a computer system for automatically setting simulation conditions according to an embodiment.

FIG. 5 is a simplified block diagram of a computer-based system 550 that may be used to generate and optimize a real-world object according to any variety of the embodiments of the present invention described herein. The system 550 comprises a bus 553. The bus 553 serves as an interconnect between the various components of the system 550. Connected to the bus 553 is an input/output device interface 556 for connecting various input and output devices such as a keyboard, mouse, display, speakers, etc. to the system 550. A central processing unit (CPU) 552 is connected to the bus 553 and provides for the execution of computer instructions. Memory 555 provides volatile storage for data used for carrying out computer instructions. Storage 554 provides non-volatile storage for software instructions, such as an operating system (not shown). The system 550 also comprises a network interface 551 for connecting to any variety of networks known in the art, including wide area networks (WANs) and local area networks (LANs).

It should be understood that the example embodiments described herein may be implemented in many different ways. In some instances, the various methods and machines described herein may each be implemented by a physical, virtual, or hybrid general purpose computer, such as the computer system 550, or a computer network environment such as the computer environment 660, described herein below in relation to FIG. 6. The computer system 550 may be transformed into the machines that execute the methods described herein, for example, by loading software instructions into either memory 555 or non-volatile storage 554 for execution by the CPU 552. One of ordinary skill in the art should further understand that the system 550 and its various components may be configured to carry out any embodiments or combination of embodiments of the present invention described herein. Further, the system 550 may implement the various embodiments described herein utilizing any combination of hardware, software, and firmware modules operatively coupled, internally, or externally, to the system 550. Further, the system 550 may be communicatively coupled to or be embedded within a manufacturing device so as to control the device to create a physical object as described herein.

Figure 6:
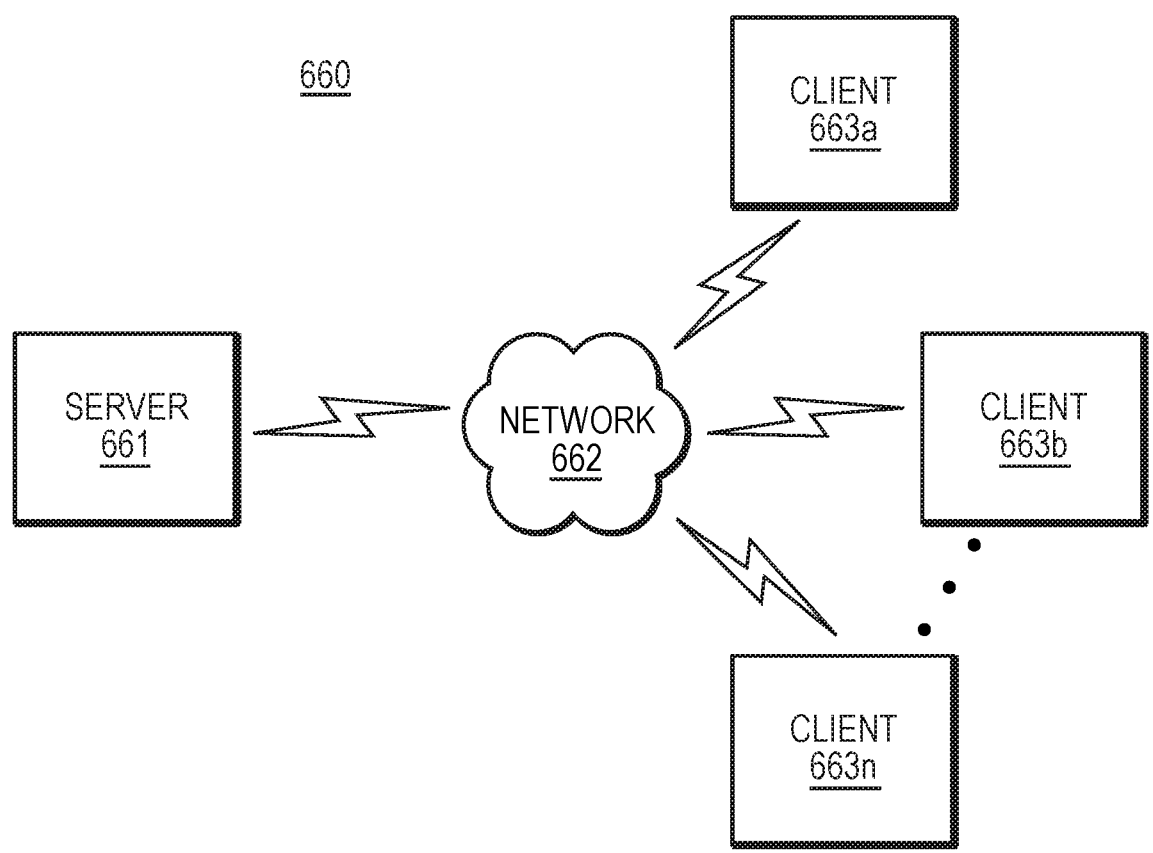
FIG. 6 is a simplified diagram of a computer network environment in which an embodiment of the present invention may be implemented.

FIG. 6 illustrates a computer network environment 660 in which an embodiment of the present invention may be implemented. In the computer network environment 660, the server 661 is linked through the communications network 662 to the clients 663*a-n*. The environment 660 may be used to allow the clients 663*a-n*, alone or in combination with the server 661, to execute any of the methods described herein. For non-limiting example, computer network environment 660 provides cloud computing embodiments, software as a service (SAAS) embodiments, and the like.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and thus, the data processors described herein are intended for purposes of illustration only and not as a limitation of the embodiments.

While example embodiments have been particularly shown and described, it will be understood by those skilled in the art that various changes in form and details may be made therein without departing from the scope of the embodiments encompassed by the appended claims.

What is claimed is:

1. A computer-implemented method of automatically setting conditions for a simulation that enables determining geometric design of a real-world physical object represented by a computer aided design (CAD) model, the method comprising:

by a processor, automatically analyzing morphology of a CAD model representing a real-world physical object and identifying a function of an element of the CAD model, the element representing a part of the real-world physical object, wherein (i) the identified function is a certain working operation of the part in the real-world physical object identified from among a plurality of different working operations for the part and (ii) each of the plurality of different working operations have different respective loading conditions and boundary conditions; and by the processor, responsively designing the real-world physical object represented by the CAD model through performing a simulation, where performing the simulation includes:

automatically setting conditions in the simulation of the real-world physical object by defining, in memory associated with the processor, (i) a given location of a loading condition on surfaces of the element of the CAD model, from among a plurality of locations on the surfaces of the element of the CAD model, (ii) direction of the loading condition on the surfaces of the element of the CAD model, and (iii) location of a boundary condition on the surfaces of the element of the CAD model, wherein the given location of the loading condition, direction of the loading condition, and location of the boundary condition are defined based upon one or more rules stored in a database as corresponding to the identified function of the part of the real-world physical object represented by the CAD model, where the one or more rules indicate the defined given location of the loading condition, direction of the loading condition, and location of the boundary condition; and executing the simulation using the defined loading condition and boundary condition, wherein executing the simulation enables determining and providing a three-dimensional (3D) geometric design of the real-world physical object.

2. The method of claim 1 wherein analyzing the morphology of the CAD model includes analyzing at least one of: topology and dimensions of the element of the CAD model.

3. The method of claim 1 wherein the defining is further based on a solver type of the simulation.

4. The method of claim 3 wherein the one or more rules correspond to both the identified function of the part of the real-world physical object represented by the CAD model and the solver type.

5. The method of claim 1 wherein the one or more rules corresponding to the identified function of the part of the real-world physical object represented by the CAD model are predefined.

6. The method of claim 5 wherein the one or more predefined rules are user developed rules associating at least one of a loading condition and a boundary condition with functionality of a part of a real-world physical object.

7. The method of claim 1 further comprising:
identifying the one or more rules from a plurality of CAD models with previously defined simulation conditions.

8. The method of claim 7 wherein identifying the one or more rules from a plurality of CAD models with previously defined simulation conditions identifies associations between functionality of parts of respective real-world physical objects represented by the plurality of CAD models, and said previously defined simulation conditions including at least one of boundary conditions and loading conditions previously defined for the parts of the respective real-world physical objects represented by the plurality of CAD models.

9. The method of claim 1 wherein defining the given location on the surfaces of the element of the CAD model, the direction of the loading condition on the surfaces of the element of the CAD model, and the location of the boundary condition on the surfaces of the element of the CAD model is further based upon a real-world material of the part of the real-world physical object that the element of the CAD model represents.

10. The method of claim 1 wherein the element of the CAD model is formed by a plurality of boundary representations, and the step of defining includes defining at least one of a boundary condition and a loading condition for each of the boundary representations in the plurality.

11. A system to automatically set conditions for a simulation that enables determining geometric design of a real-world physical object represented by a computer aided design (CAD) model, the system comprising:
a processor; and
a memory with computer code instructions stored thereon, the processor and the memory, with the computer code instructions, being configured to cause the system to:
automatically analyze morphology of a CAD model representing a real-world physical object and identify a function of an element of the CAD model, the element representing a part of the real-world physical object, wherein (i) the identified function is a certain working operation of the part in the real-world physical object identified from among a plurality of different working operations for the part and (ii) each of the plurality of different working operations have different respective loading conditions and boundary conditions; and
responsively design the real-world physical object represented by the CAD model through performing a simulation, where performing the simulation includes:
automatically setting conditions in the simulation of the real-world physical object by defining, in the memory, (i) a given location of a loading condition on surfaces of the element of the CAD model, from among a plurality of locations on the surfaces of the element of the CAD model, (ii) direction of the loading condition on the surfaces of the element of the CAD model, and (iii) location of a boundary condition on the surfaces of the element of the CAD model, wherein the given location of the loading condition, direction of the loading condition, and location of the boundary condition are defined based upon one or more rules stored in a database as corresponding to the identified function of the part of the real-world physical object represented by the CAD model, where the one or more rules indicate the defined given location of the loading condition, direction of the loading condition, and location of the boundary condition; and
executing the simulation using the defined loading condition and boundary condition, wherein executing the simulation enables determining and providing a three-dimensional geometric design of the real-world physical object.

12. The system of claim 11 where, in analyzing the morphology of the CAD model, the processor and the memory, with the computer code instructions, are further configured to cause the system to:
analyze at least one of: topology and dimensions of the element of the CAD model.

13. The system of claim 11 wherein the defining is further based on a solver type of the simulation.

14. The system of claim 13 wherein the one or more rules correspond to both the identified function of the part of the real-world physical object represented by the CAD model and the solver type.

15. The system of claim 11 wherein the one or more rules corresponding to the identified function of the part of the real-world physical object represented by the CAD model are predefined.

16. The system of claim 15 wherein the one or more predefined rules are user developed rules associating at least one of a loading condition and a boundary condition with functionality of a part of a real-world physical object.

17. The system of claim 11 wherein the processor and the memory, with the computer code instructions, are further configured to cause the system to:
identify the one or more rules from a plurality of CAD models with previously defined simulation conditions.

18. The system of claim 17 where, in identifying the one or more rules from a plurality of CAD models with previously defined simulation conditions, the processor and the memory, with the computer code instructions, are further configured to cause the system to:
identify associations between functionality of parts of respective real-world physical objects represented by the plurality of CAD models, and said previously defined simulation conditions including at least one of boundary conditions and loading conditions previously defined for the parts of the respective real-world physical objects represented by the plurality of CAD models.

19. The system of claim 11 wherein the element of the CAD model is formed by a plurality of boundary representations and, in the defining, the processor and the memory, with the computer code instructions, are further configured to cause the system to:
define location of at least one of a boundary condition and a loading condition for each of the boundary representations in the plurality.

20. A non-transitory computer program product to automatically set conditions for a simulation that enables determining geometric design of a real-world physical object represented by a computer aided design (CAD) model, the computer program product executed by a server in communication across a network with one or more clients and comprising:
a non-transitory computer readable medium storing program instructions which, when executed by a processor, causes the processor to:
automatically analyze morphology of a CAD model representing a real-world physical object and identify a function of an element of the CAD model, the element representing a part of the real-world physical object, wherein the identified function is a certain working operation of the part in the real-world physical object identified from among a plurality of different working operations for the part and (ii) each of the plurality of different working operations have different respective loading conditions and boundary conditions; and
responsively design the real-world physical object represented by the CAD model through performing a simulation, where performing the simulation includes:
automatically setting conditions in the simulation of the real-world physical object by defining, in memory associated with the processor, (i) a given location of a loading condition on surfaces of the element of the CAD model, from among a plurality of locations on the surfaces of the element of the CAD model, (ii) direction of the loading condition on the surfaces of the element of the CAD model and (iii) location of a boundary condition on the surfaces of the element of the CAD model, wherein the given location of the loading condition, direction of the loading condition, and location of the boundary condition are defined based upon one or more rules stored in a database as corresponding to the identified function of the part of the real-world physical object represented by the CAD model, where the one or more rules indicate the defined given location of the loading condition, direction of the loading condition, and location of the boundary condition; and executing the simulation using the defined loading condition and boundary condition, wherein executing the simulation enables determining and providing a three-dimensional (3D) geometric design of the real-world physical object.

\* \* \* \* \*

UNITED STATES PATENT AND TRADEMARK OFFICE
CERTIFICATE OF CORRECTION

| | | |
|---|---|---|
| PATENT NO. | : 11,281,824 B2 | Page 1 of 1 |
| APPLICATION NO. | : 15/841081 | |
| DATED | : March 22, 2022 | |
| INVENTOR(S) | : Van der Velden | |

It is certified that error appears in the above-identified patent and that said Letters Patent is hereby corrected as shown below:

In the Claims

In Claim 20, Column 14, Line 52, delete "wherein the identified function" and insert -- wherein (i) the identified function --

Signed and Sealed this
Twelfth Day of July, 2022

Katherine Kelly Vidal
*Director of the United States Patent and Trademark Office*